United States Patent
Dohi et al.

(10) Patent No.: US 11,769,650 B2
(45) Date of Patent: Sep. 26, 2023

(54) MULTISTAGE-CONNECTED MULTIPOLE, MULTISTAGE MULTIPOLE UNIT, AND CHARGED PARTICLE BEAM DEVICE

(71) Applicant: Hitachi High-Tech Corporation, Tokyo (JP)

(72) Inventors: Hideto Dohi, Tokyo (JP); Yoshinobu Ootaka, Tokyo (JP); Masashi Inada, Tokyo (JP); Hideyuki Kazumi, Tokyo (JP); Hideo Kashima, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 334 days.

(21) Appl. No.: 17/297,581

(22) PCT Filed: Dec. 23, 2019

(86) PCT No.: PCT/JP2019/050318
§ 371 (c)(1),
(2) Date: May 27, 2021

(87) PCT Pub. No.: WO2020/153074
PCT Pub. Date: Jul. 30, 2020

(65) Prior Publication Data
US 2022/0037113 A1     Feb. 3, 2022

(30) Foreign Application Priority Data

Jan. 21, 2019    (JP) .................................. 2019-007890

(51) Int. Cl.
*H01J 37/28*     (2006.01)
*H01J 37/141*    (2006.01)
(Continued)

(52) U.S. Cl.
CPC .......... *H01J 37/28* (2013.01); *H01J 37/1413* (2013.01); *H01J 37/1474* (2013.01);
(Continued)

(58) Field of Classification Search
CPC .. H01J 37/00; H01J 37/02; H01J 37/26; H01J 37/28; H01J 37/1413; H01J 37/1474; H01J 37/153; H01J 2237/032; H01J 2237/1534
(Continued)

(56) References Cited

U.S. PATENT DOCUMENTS 10,646,941 B2   5/2020   Elliot et al.
2007/0278416 A1*   12/2007   Kawai .................. H01J 37/153
250/396 ML (Continued)

FOREIGN PATENT DOCUMENTS

JP     2003-288855 A    10/2003
JP     2007-287365 A    11/2007
(Continued)

OTHER PUBLICATIONS

International Search Report (PCT/ISA/210) issued in PCT Application No. PCT/JP2019/050318 dated Mar. 24, 2020 with English translation (five (5) pages).
Japanese-language Written Opinion (PCT/ISA/237) issued in PCT Application No. PCT/JP2019/050318 dated Mar. 24, 2020 (three (3) pages).

*Primary Examiner* — Jason L McCormack
(74) *Attorney, Agent, or Firm* — Crowell & Moring LLP

(57) ABSTRACT

Provided are a multistage-connected multipole and a charged particle beam device that can be produced with precision in machining without requiring precision in brazing between a pole and an insulation material. This multistage connected multipole 100 comprises: a plurality of poles Q1-Q4 that are arranged along the optical-axis direction of a charged particle beam, and that have cutouts N on surfaces facing each other; and braces P1-P3 that are arranged between the plurality of poles Q1-Q4 and are made of an insulator. The poles Q1-Q4 and the braces P1-P3 are joined by fitting the braces P1-P3 into the cutouts N and
(Continued)

applying brazing so as to be interposed by a bonding material.

20 Claims, 9 Drawing Sheets

(51) Int. Cl.
*H01J 37/147* (2006.01)
*H01J 37/153* (2006.01)

(52) U.S. Cl.
CPC ....... *H01J 37/153* (2013.01); *H01J 2237/032* (2013.01); *H01J 2237/1534* (2013.01)

(58) Field of Classification Search
USPC ....................................... 250/396 R
See application file for complete search history.

(56) References Cited

U.S. PATENT DOCUMENTS

| | | | |
|---|---|---|---|
| 2009/0039281 A1* | 2/2009 | Kawasaki | H01J 37/26 250/311 |
| 2012/0049702 A1* | 3/2012 | DiFonzo | B29C 70/84 156/182 |
| 2013/0320227 A1 | 12/2013 | Urano et al. | |
| 2015/0248944 A1 | 9/2015 | Cheng et al. | |
| 2015/0287566 A1 | 10/2015 | Kohno et al. | |

FOREIGN PATENT DOCUMENTS

| | | |
|---|---|---|
| JP | 2009-43533 A | 2/2009 |
| JP | 2012-209130 A | 10/2012 |
| JP | 2015-153565 A | 8/2015 |
| JP | 2015-162393 A | 9/2015 |
| JP | 2018-172281 A | 11/2018 |

* cited by examiner

PARTIAL ENLARGED VIEW

MULTISTAGE-CONNECTED MULTIPOLE, MULTISTAGE MULTIPOLE UNIT, AND CHARGED PARTICLE BEAM DEVICE

TECHNICAL FIELD

The present invention relates to a multistage-connected multipole, a multistage multipole unit, and a charged particle beam device in which such a multistage multipole can be used.

BACKGROUND ART

In manufacturing processes for semiconductor devices, charged particle beam devices are used which apply a charged particle beam to an LSI and detect a secondary electron generated from the specimen, thereby measuring the dimensions of a pattern shape or inspecting any defect and especially, SEMs (Scanning Electron Microscopes) are frequently used. Such a charged particle beam device contributes to enhancement of the performance of semiconductor devices and enhancement of the scale of integration by microminiaturization for cost reduction.

Enhancement of equipment resolution is indispensable to fine pattern measurement with a SEM. In a SEM, by applying an electron beam to a specimen with a high acceleration voltage, a spot size of the electron beam is reduced and a high-resolution SEM image can be picked up. However, when an acceleration voltage is increased, a specimen can be damaged and a fine pattern can be shrunk, or an electron beam can pass through the fine pattern, preventing surface information from being obtained from the fine pattern. For this reason, a low-acceleration voltage and high-resolution SEM is required.

To reduce a spot size of an electron beam regardless of the electron beam's acceleration voltage being low, a spherical aberration and a chromatic aberration of a charged particle beam optical system must be corrected. For this reason, there is need for a SEM for measurement and inspection whose electro-optical system is equipped with an aberration corrector.

An aberration corrector has a single-stage or multistage pole to generate an electromagnetic field, thereby exerting the action of a concave lens on an electron beam to compensate an aberration. However, unless an electromagnetic field of a proper spatial distribution is generated, a parasitic aberration is produced and a spot size of an electron beam cannot be reduced. When a produced parasitic aberration is great, a correction coil must be separately used to correct the aberration or a voltage and a current of an individual pole must be independently adjusted, and as a result, control is complicated. To reduce an amount of a produced parasitic aberration, a multipole must be machined and assembled with accuracy.

Patent Literature 1 discloses a method for manufacturing a highly accurate multipole. In this method, a member having six multipoles and a yoke is integrally formed from a single material and two pieces of such integrally formed members are prepared. A coil is wound around a connecting part between a multipole and the yoke of the two integrally formed members and thereafter, the two integrally formed members are stacked and secured together. As a result, a dodecapole lens with 12 single-stage poles disposed is formed. According to this method, a number of parts can be reduced and further, an assembly tolerance of a pole can be reduced.

Patent Literatures 2 and 3 disclose a method in which a plurality of single-stage poles are disposed and the single-stage poles are connected together by an insulation material by brazing to form a multistage pole, which is in turn secured on a base block having a groove.

Patent Literature 3 discloses a method in which a multistage multipole lens is manufactured by: fitting and securing a multistage-connected pole in a groove of a cylindrical housing formed of a non-magnetic material having a plurality of grooves parallel to the direction of an optical axis; and thereafter, attaching a shaft and a yoke of a magnetic material with a coil wound therearound.

To manufacture a multistage multipole with accuracy, the conventional arts involve the following problems:

In the method disclosed in Patent Literature 1, six poles integrally machined from one member can be manufactured with the accuracy of machining. However, when two members are assembled together, an assembly tolerance between the members cannot be avoided and the assembly tolerance causes a parasitic aberration. Further, since poles are joined together by a yoke, the poles cannot be electrically insulated from each other and thus, an electrostatic multipole lens cannot be fabricated. For this reason, with the method according to Patent Literature 1, a spherical aberration device can be manufactured but a chromatic aberration corrector cannot be manufactured. Since single-stage lenses are stacked to increase a stage of single-stage multipole lenses, production of an assembly tolerance cannot be avoided and displacement of the magnetic field center of a generated multipole magnetic field from stage to stage and inclination of a magnetic field generating plane are difficult to avoid.

In the methods disclosed in Patent Literature 2 and Patent Literature 3, since poles are machined one by one before brazing, the accuracy of arrangement (positions of pole tips) of the poles in the second and following stages of a multistage pole member relative to the pole in the first stage depends on accuracy in brazing an insulation material. When brazing an insulation material, two elements, the tip position and the angle of a pole, must be determined with accuracy on the order of several μm to several tens of μm. Since an aberration corrector uses a large number of multistage-connected multipoles, the aberration corrector is low in mass productivity and variation in the accuracy of multistage-connected multipoles and manufacturing reproducibility depend on workers.

In the method disclosed in Patent Literature 2, a multistage-connected multipole is secured on a base block. The method disclosed in Patent Literature 3 involves a gap between a housing and a pole. For this reason, when a magnetic material shaft is attached to a pole, there is a possibility that each pole is deformed by stress exerted on a pole member and fastening between a base block and a housing is loosened, a multistage-connected multipole member being displaced.

CITATION LIST

Patent Literature

[Patent Literature 1] Japanese Unexamined Patent Application Publication No. 2015-153565
[Patent Literature 2] Japanese Unexamined Patent Application Publication No. 2009-43533

[Patent Literature 3] Japanese Unexamined Patent Application Publication No. 2012-209130

SUMMARY OF INVENTION

Technical Problem

It is an object of the present invention to provide a multistage-connected multipole which can be fabricated with the accuracy of machining without requiring accuracy in brazing between a pole and an insulation material and a charged particle beam device.

Solution to Problem

A multistage-connected multipole according to the present invention includes: a plurality of poles disposed along the optical axis direction of a charged particle beam and having a notch in opposite surfaces; and a pillar formed of an insulator disposed between the poles. The poles and the pillars are joined with each other in the notch via a joining material.

Advantageous Effects of Invention

According to the present invention, a multistage-connected multipole can be fabricated with the accuracy of machining without requiring accuracy in brazing between a pole and an insulation material. A multistage-connected multipole, a multistage multipole unit, and a charged particle beam device in which both accuracy and mass productivity are achieved can be provided.

DESCRIPTION OF EMBODIMENTS

Hereafter, a description will be given to embodiments of the present invention with reference to the accompanying drawings. In the accompanying drawings, functionally identical elements may be marked with an identical reference number or a corresponding number. The accompanying drawings illustrate embodiments and implementations in accordance with the principle of the present disclosure; however, these embodiments and implementations are intended for understanding of the present disclosure and are not used to limitedly interpret the present disclosure at all. The description in the present specification is just a typical example and does not limit the claims or application examples of the present disclosure in any sense.

Embodiments of the present invention are described in detail sufficiently for those skilled in the art to implement the present disclosure. Any other implementation or embodiment is possible and it should be understood that the configuration and structure of the embodiments can be modified and a wide variety of elements can be substituted without departing from the scope or spirit of the technical ideas of the present disclosure. Therefore, the following description should not be interpreted in a limited manner.

In the following description of embodiments, a case where the present invention is applied to an inspecting and measuring instrument adopting a scanning electron microscope (SEM) using an electron beam is taken as an example. However, these embodiments should not be interpreted in a limited manner and the present invention is also applicable to, for example, a device using a charged particle beam of ions or the like and an ordinary observing instrument.

First Embodiment

Figure 1:
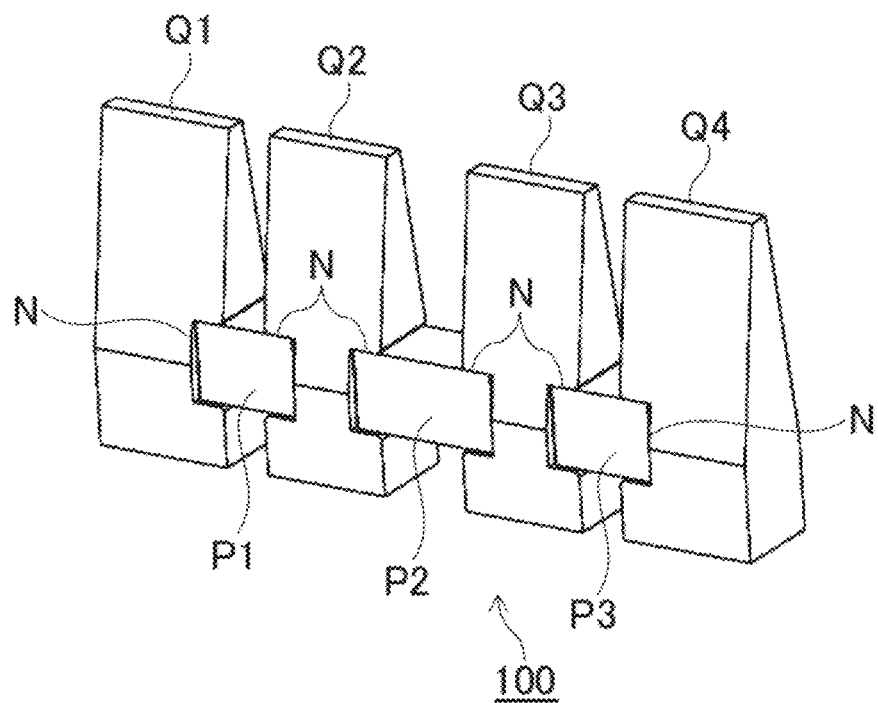
FIG. 1 is a schematic perspective view illustrating a structure of a multistage-connected multipole 100 in First Embodiment.

A description will be given to a multistage-connected multipole 100 (hereafter, simply referred to as "multipole 100") in First Embodiment with reference to FIG. 1 and FIG. 2. The multipole 100 shown in FIG. 1 is a four-stage multistage-connected multipole constituting a part of a chromatic and spherical aberration corrector comprised of 12 poles and four stages.

The multipole 100 is formed by disposing four poles, a first-stage pole Q1, a second-stage pole Q2, a third-stage pole Q3, and a fourth-stage pole Q4, along the optical axis direction of a charged particle beam device. Each of pole Q1 to Q4 is formed using such soft magnetic metal as pure iron, permalloy, or Permendur as a material so that a magnetic field can be guided.

Each of pole Q1 to Q4 is provided in a surface opposite an adjacent pole with a notch N for fitting a pillar P1 to P3, described later. The first-stage pole Q1 and the fourth-stage pole Q4 positioned at both ends of the multipole 100 are respectively provided with a notch N only in one side face. The second-stage pole Q2 and the third-stage pole Q3 are respectively provided with a notch N in both the side faces of the pole.

The individual poles Q1 to Q4 are disposed along the optical axis direction of the charged particle beam device so that the notches N are opposed to each other. A pillar P1, P2, P3 formed using, for example, such ceramic as alumina as a material is placed in each notch N. Each notch N and a pillar P1, P2, P3 are joined with each other by brazing and thus, each pole Q1 to Q4 and the pillars P1 to P3 are integrated with each other.

Figure 2:
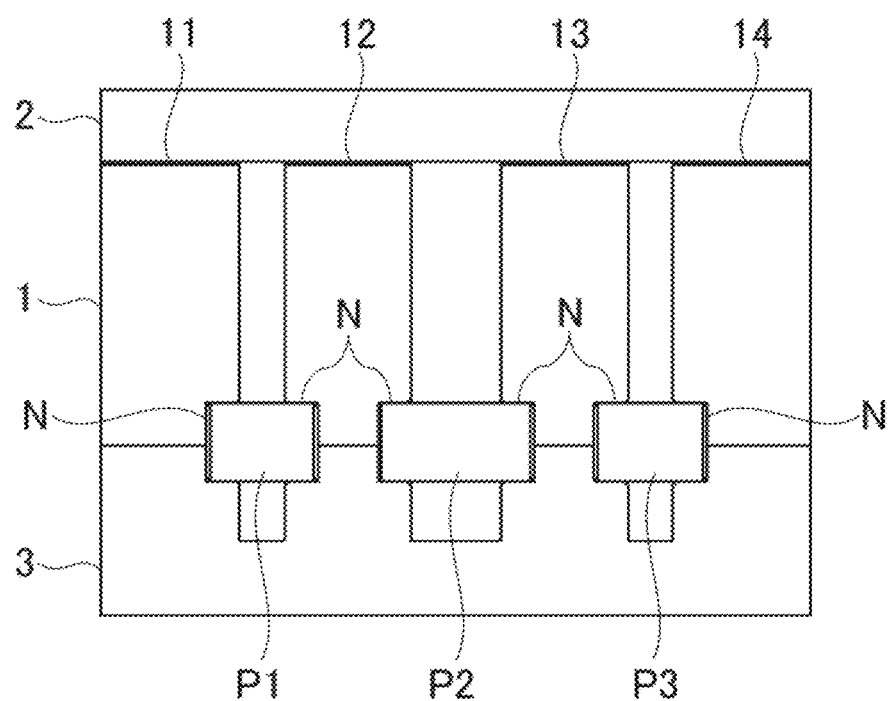
FIG. 2 is a diagrammatic sketch illustrating a brazing process performed in the multistage-connected multipole 100 shown in FIG. 1.

FIG. 2 is a diagrammatic sketch illustrating a brazing process performed in the multipole 100 shown in FIG. 1. A pole base material 1 is single soft magnetic metal and is integrally formed by machining. The pole base material 1 includes four blocks 11 to 14. These blocks ultimately become the above-mentioned poles Q1 to Q4. A notch N is provided in inner side faces of the blocks 11 and 14 and in both the side faces of the blocks 12 and 13.

Each of the blocks 11 to 14 is connected to a tip side connecting portion 2 and a rear face side connecting portion 3 at the block's tip (one end) and rear face (the other end). The tip side connecting portion 2 and the rear face side connecting portion 3 constitute a part of the pole base material 1 together with the blocks 11 to 14. A more specific description will be given. Before joined to the pillars P1 to P3 by a joining material (brazing material), the blocks 11 to 14 to be the poles Q1 to Q4 are connected to the common tip side connecting portion 2 and rear face side connecting portion 3 and constitute a single pole base material together with the tip side connecting portion 2 and the rear face side connecting portion 3. After joining of the pillars P1 to P3, the tip side connecting portion 2 and the rear face side connecting portion 3 are cut and separated; and as a result, the blocks 11 to 14 become the poles Q1 to Q4 as physically independent members. Since the tip side connecting portion 2 and the rear face side connecting portion 3 are respectively cut and separated along one cutting plane, a plurality of end faces of the separated poles Q1 to Q4 have a shape in accordance with one plane defined by the cutting plane. The blocks 11 to 14 are connected to the tip side connecting portion 2 and the rear face side connecting portion 3 at intervals in accordance with a design value of the multistage-connected multipole 100.

When brazing is performed, the pillars P1 to P3 are placed in the notches N provided in the pole base material 1 and for example, such an alloy as silver solder is placed between individual pillars and notches and brazing is performed. After brazing, the tip side connecting portion 2 and the rear face side connecting portion 3 are removed by machining. The blocks 11 to 14 respectively become the poles Q1 to Q4 and the multistage-connected multipole 100 of four stages shown in FIG. 1 is formed.

According to the present embodiment, the individual blocks 11 to 14 in the pole base material 1 can be integrally machined in accordance with identical working standard and working condition; therefore, the dimensions of each block 11 to 14 and the distance between the blocks 11 to 14 can be machined with the accuracy of micrometer.

In addition, the removal of the tip side connecting portion 2 and the rear face side connecting portion 3 is also integrally performed by machining in accordance with identical working standard and working condition; therefore, the poles Q1 to Q4 and the intervals between and directions of the poles can be formed with the accuracy of micrometer without a deviation from stage to stage.

Further, also when a plurality of multistage-connected multipoles of four stages are fabricated, identical working standard, working condition, and machining jigs can be used and the multipoles can be machined with variation with the accuracy of micrometer.

In First Embodiment, the arrangement of the pillars P1, P2, P3 does not have an influence on positional accuracy between the poles Q1 to Q4. A more specific description will be given. When the blocks 11 to 14 to be the poles Q1 to Q4 have been yet integrated with the tip side connecting portion 2 and the rear face side connecting portion 3, the pillars P1 to P3 are fit into the notches N and brazed. The poles Q1 to Q4 can be joined by fitting the pillars P1 to P3 into the notches N regardless of the magnitude of any error in the intervals between the poles Q1 to Q4 and joining the poles by a joining material for brazing. For this reason, the positions of the pillars P1 to P3 need not be adjusted during brazing. Therefore, as compared with a manufacturing method of brazing single poles together to pillars, a brazing process produces a higher yield and as a result, a yield of a process of forming multistage-connected multipoles can also be enhanced.

According to First Embodiment, the pole base material 1 has two connecting portions (tip side connecting portion 2 and rear face side connecting portion 3) on the tip side and the rear face side. This contributes to the prevention of deformation in the blocks due to stress accumulated in the pole base material 1 during machining of the pole base material 1, being released by heat during brazing.

A number or position of the connecting portions in the pole base material 1 is not limited to those shown in the drawing and a connecting portion in the pole base material 1 may also be provided only on either of the tip side and the rear face side. A number of pole stages is not limited to four and any number equal to or higher than two is acceptable for pole stages.

Also, a shape of the pillars P1 to P3 is not limited to a specific one. FIG. 1 shows the pillars P1 to P3 in a square pole shape as an example but the present invention is not limited to this and the pillars may be in a cylindrical shape, a triangle pole shape, a trapezoid shape, or the like. A material of the pillars P1 to P3 is not limited to alumina and the present embodiment is applicable to any material as long as the material is ceramic or any other insulation material that can be brazed to metal. The present multistage-connected multipole is applicable not only to a chromatic and spherical aberration corrector but also to a spherical aberration corrector, a stigmator, a Wien filter, a defector in a multipole configuration, and the like.

Second Embodiment

A description will be given to a multistage-connected multipole 100A in Second Embodiment with reference to FIG. 3 and FIG. 4. Also, in the description of Second Embodiment, the multistage-connected multipole 100A of four stages constituting a part of a chromatic and spherical aberration corrector comprised of 12 poles and four stages is taken as an example.

Figure 3:
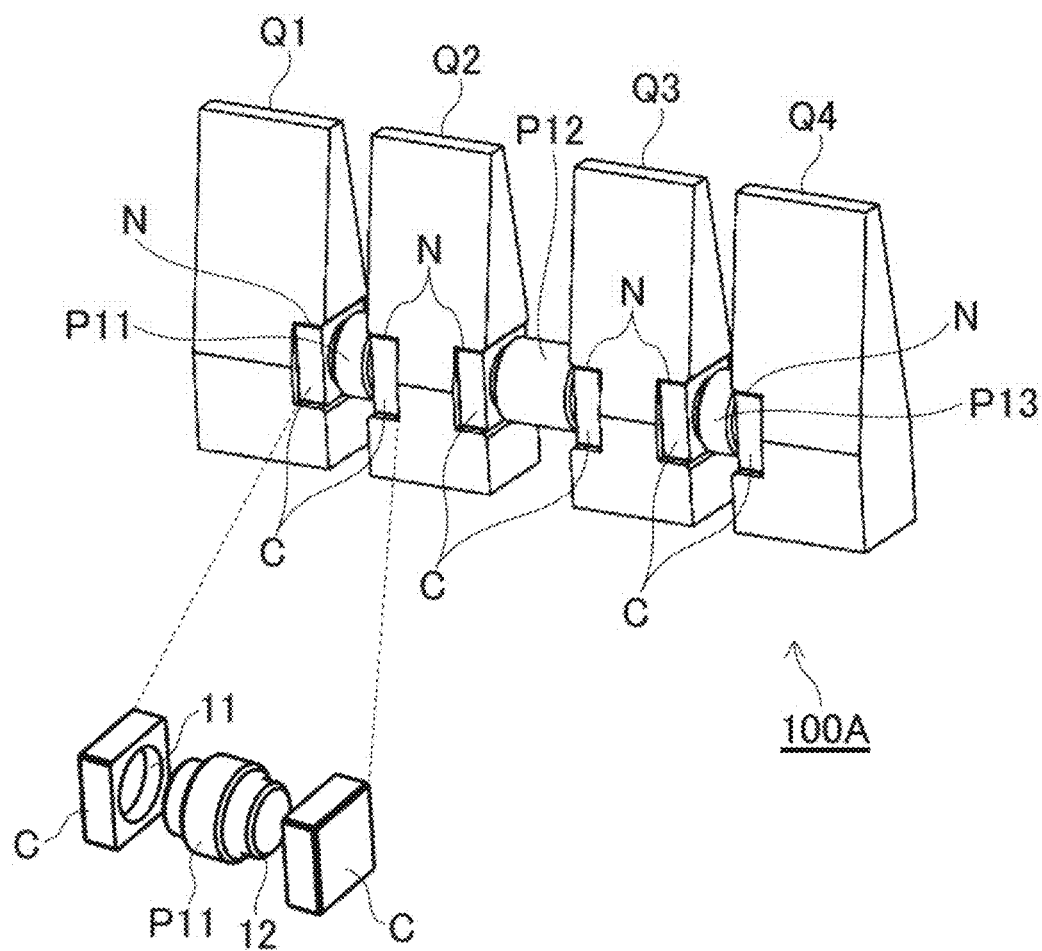
FIG. 3 is a schematic perspective view illustrating a structure of a multistage-connected multipole 100A in Second Embodiment.

FIG. 3 is a schematic perspective view illustrating a configuration of the multistage-connected multipole 100A (hereafter, simply referred to as "multipole 100A"). In FIG. 3, the same components as those of the multipole 100 in FIG. 1 will be marked with the same reference signs and an overlapped description will be hereafter omitted.

The multipole 100A in Second Embodiment is different from the multipole 100 in First Embodiment in a structure of a member fit in each notch N. The structure of the poles Q1 to Q4 is identical with that in the multipole 100 in First Embodiment. In Second Embodiment, a cap C is fit in each notch N. The cap C is substantially identical with the notch N in shape and configured in such a size that the cap can be fit with a predetermined gap provided so that the cap can be fit into a notch N. The cap C is provided at the center of the cap with a recessed portion 11. A material of the cap C is preferably the same as a material of the pole Q1 to Q4.

Unlike the pillars P1, P2, P3 in First Embodiment, pillars P11, P12, P13 are not fit directly into a notch N but are fit into a notch N through the recessed portion 11 of a cap C. The pillars P11 to P13 have a protrusion 12 (protruded portion) for engagement with the recessed portion 11 of a cap C. The protrusion 12 is substantially identical with the recessed portion 11 in shape and is so configured that the protrusion can be fit into a recessed portion 11 with a predetermined gap in between. After fitting, the poles Q1 to Q4 and the caps C and the pillars P11 to P13 and the caps C are joined and integrated by brazing as in First Embodiment. In the example shown in FIG. 3, the caps C have the recessed portion 11 and the pillars P11 to P13 have the protrusion 12 to be fit into the recessed portion. Conversely, the caps C may have a protrusion and the pillars P11 to P13 may have a recessed portion into which the protrusion is inserted.

Figure 4:
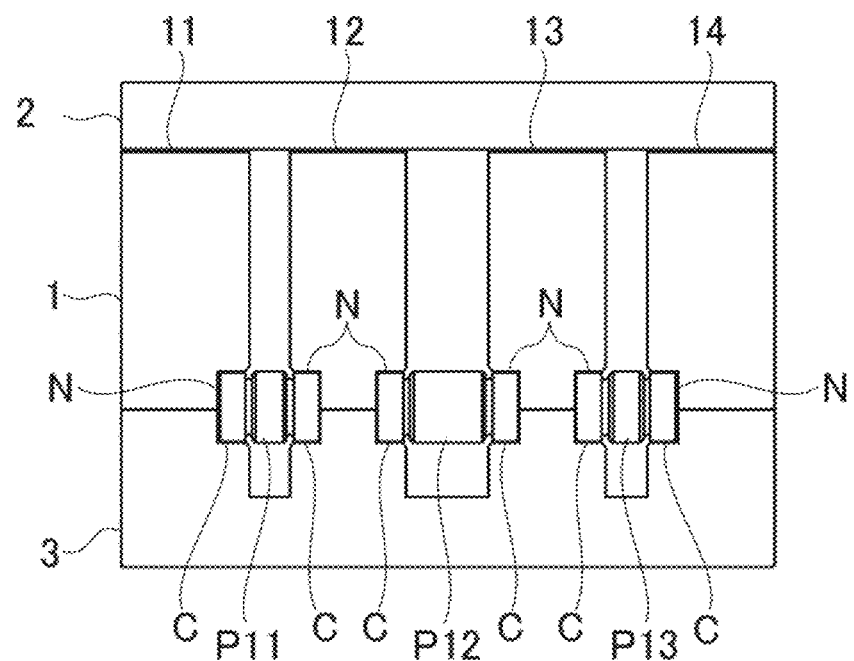
FIG. 4 is a diagrammatic sketch illustrating a brazing process performed in the multistage-connected multipole 100A shown in FIG. 3.

FIG. 4 is a diagrammatic sketch illustrating a brazing process performed in the multipole 100A shown in FIG. 3. In FIG. 4, the same members as those in FIG. 3 will be marked with the same reference signs and an overlapped description will be hereafter omitted. As described in relation to FIG. 3, the notches N have the pillar P11 to P13 fit into the notches through a cap C and are joined by brazing. Also, in the process (FIG. 4) in Second Embodiment, the arrangement of the caps C and the pillars P11 to P13 do not have an influence on the positional accuracy between the poles Q1 to Q4; therefore, the position of each member need not be adjusted during brazing. Since the pole base material 1 and the caps C can be formed of identical metal, brazing is facilitated. Since the protrusions 12 of the pillars P11 to P13 are engaged with the recessed portions 11 provided in the caps C, different materials can be easily and firmly brazed together. For this reason, Second Embodiment allows a yield of a brazing process to be further enhanced as compared with First Embodiment.

Third Embodiment

A description will be given to a chromatic and spherical aberration corrector 200 (hereafter, simply referred to as "aberration corrector 200") in Third Embodiment with reference to FIG. 5 to FIG. 7. Also, in the description of Third Embodiment, a magnetic field-based chromatic and spherical aberration corrector having a multistage-connected multipole of 12 poles and four stages is taken as an example.

Figure 5:
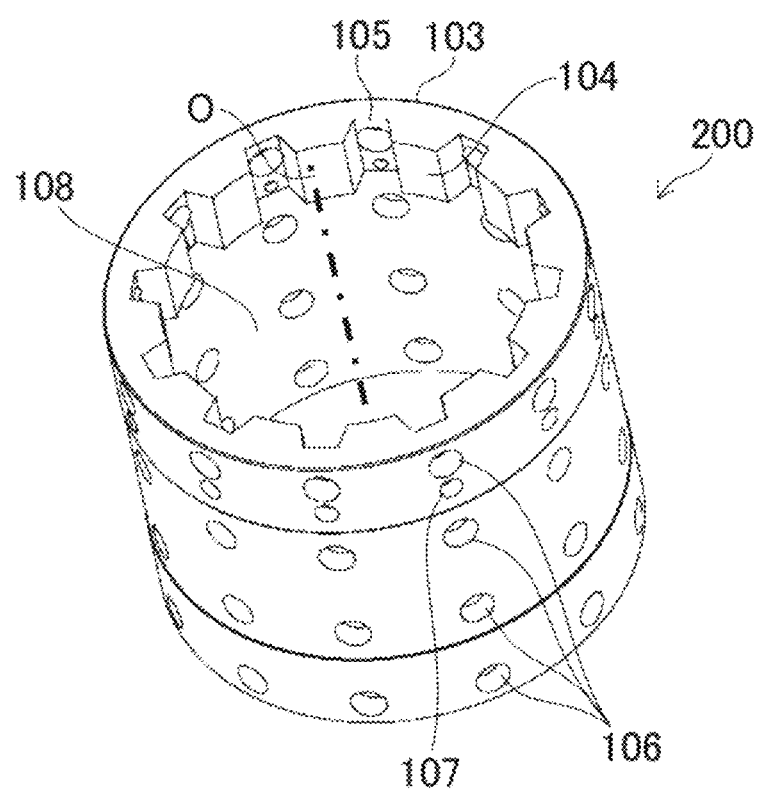
FIG. 5 is a schematic perspective view illustrating a chromatic and spherical aberration corrector 200 in Third Embodiment.

FIG. 5 is a perspective view of a housing 103 of the aberration corrector 200 in Third Embodiment. The housing 103 is in a shape of a cylinder with an axis O at the center. A multistage-connected multipole 100B shown in FIG. 6 is mounted in an inner wall of such a housing 103 to construct the aberration corrector 200. In the example shown in FIG. 5, 12 multistage-connected multipoles 100B are circumferentially disposed at equal intervals in the inner wall of the housing 103, a multipole lens of 12 poles and four stages being thereby formed. Since the housing 103 separates an externally supplied magnetic field on a pole-by-pole basis and transfers the magnetic field, the housing is formed using non-magnetic metal as a material. A number of multipoles 100B attached to one housing 103 is not limited to 12 and for example, four, six, eight, or more multipoles are also acceptable. That is, n sets (n is an integer not less than 2) of multistage-connected multipoles 100B can be incorporated to the housing 103 symmetrically with respect to the optical axis O.

As illustrated by the example shown in FIG. 5, the housing 103 includes thick portions 104 and tapered grooves 105 sandwiched between the thick portions 104 in an inner wall portion located in proximity to an end face on one side. The thick portion 104 is formed to be larger than a thin portion 108 positioned below the thick portion in circumferential thickness. The thick portions 104 are disposed at predetermined intervals in the circumferential direction of the cylindrical shape and, for example, 12 tapered grooves 105 are provided between the thick portions. The tapered groove 105 has a predetermined taper angle given to a side wall of the tapered groove and is so formed as to extend with the direction of the axis O taken as the lengthwise direction of the tapered groove.

The thin portion 108 is provided with a shaft through hole 106. The tapered groove 105 is provided with a screw through hole 107 in addition to a shaft through hole 106. The 12 tapered grooves 105 in the housing 103 can be evenly machined using identical working standard and working condition with the accuracy of micrometer.

Figure 6:
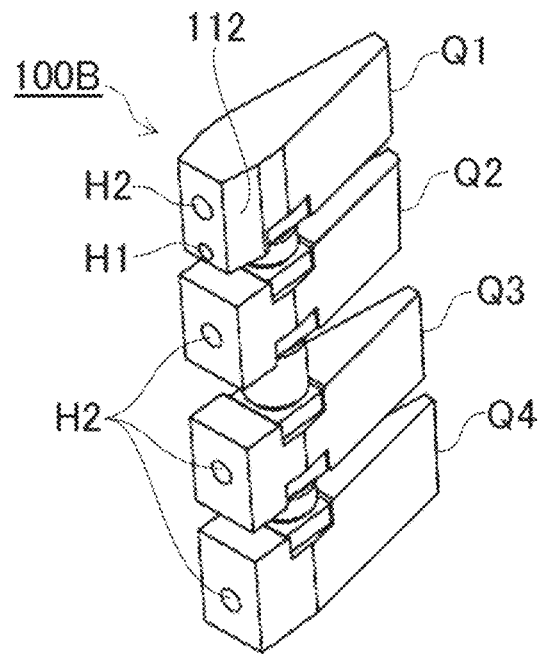
FIG. 6 is a schematic perspective view illustrating a structure of a multistage-connected multipole 100B attached to the housing 103 shown in FIG. 5.

FIG. 6 is a schematic perspective view of a multistage-connected multipole 100B (hereafter, simply referred to as "multipole 100B") attached to the housing 103. The multipole 100B can have substantially the same structure as, for example, that of the multipole 100A in Second Embodiment. However, in the multipole 100B in FIG. 6, the pole Q1 has a tapered side face 112 matched with the shape of the above-mentioned tapered groove 105 (having an identical taper angle).

In a rear face of the first-stage pole Q1, a screw hole H1 and a shaft mounting hole H2 are formed and rear faces of the poles Q2 to Q4 are provided with a shaft mounting hole H2. The screw hole H1 is a screw hole for securing the multipole 100B in the housing 103 via a screw and a screw through hole 107. The shaft mounting hole H2 is a hole into which one end of a shaft, described later, is inserted through a shaft through hole 106.

A chromatic and spherical aberration corrector 200 in Third Embodiment is constructed by incorporating the 12 multipoles 100B shown in FIG. 6 to the housing 103 shown in FIG. 5. A rear face portion of the pole Q1 having a tapered side face 112 of the multipole 100B is inserted into a tapered groove 105 provided between thick portions 104 of the housing 103. As the result of a screw being inserted into the screw hole H1 in the rear face of the pole Q1 through a screw through hole 107, the multipole 100B is secured in the housing 103.

The tapered side faces 112 of the multipole 100B and the tapered grooves 105 in the housing 103 are formed by machining and thus can be machined with accuracy. Since the tapered side faces 112 of the pole Q1 and a tapered groove 105 in the housing 103 are engaged with each other when the multipole 100B is incorporated to the housing 103, a position and a direction of the multipole 100B relative to the housing 103 can be determined without adjustment during incorporation.

Figure 7:
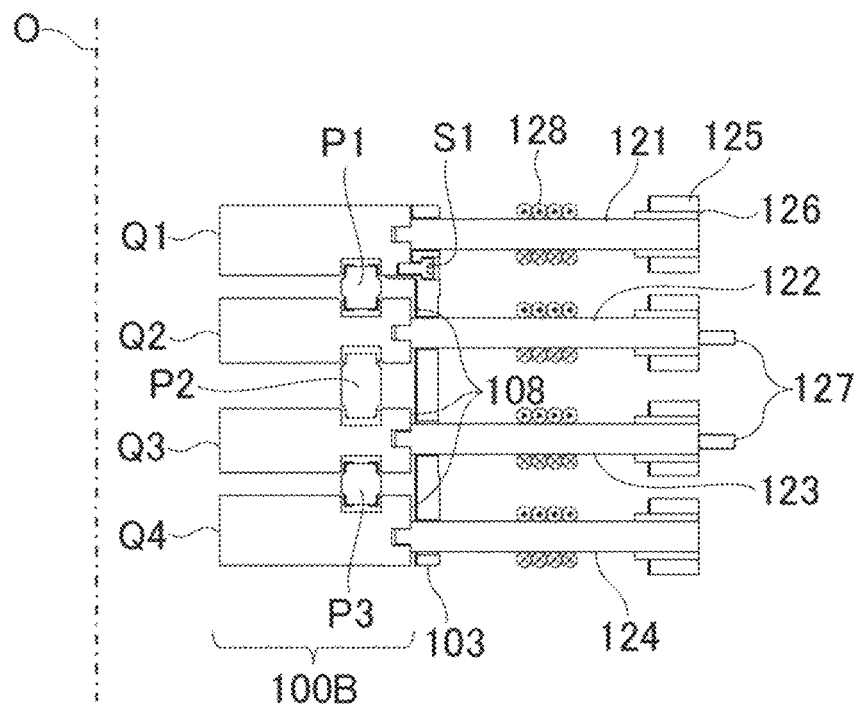
FIG. 7 is a schematic cross-sectional view of a chromatic and spherical aberration corrector 200 in Third Embodiment.

FIG. 7 is a schematic cross-sectional view of an aberration corrector 200 in Third Embodiment. FIG. 7 shows a state in which a multipole 100B is attached to an inner wall of the housing 103 and shafts 121 to 124 are attached to an outer wall of the housing 103. The shafts 121 to 124 formed of magnetic metal are inserted into the shaft mounting holes H2 in the rear faces of the poles Q1, Q2, Q3, Q4 through the shaft through holes 106 on the outer wall side of the housing 103. An excitation coil 128 is wound around each of the shafts 121 to 124. A diameter of the shaft through hole 106 is set to a sufficiently larger value than a diameter of a cross section of the shaft 121 to 124. For this reason, the shafts 121 to 124 are not brought into contact with the housing 103.

An insulation sleeve 126 formed of such an insulation material as resin is attached to a rear end portion of each shaft 121 to 124 and a cylindrical ring magnetic path 125 formed of soft magnetic metal is attached over the insulation sleeve 126. A terminal 127 for leading in a voltage is attached to rear ends of the second-stage and third-stage shafts 122, 123.

When a current is passed through the excitation coils 128, a magnetic flux is excited in the shafts 121 to 124 of soft magnetic metal and is transferred to the poles Q1 to Q4. This magnetic flux is transferred also to other poles disposed in the circumferential direction. The magnetic flux is further transferred to the shafts 121 to 124 and ring magnetic paths 125 attached to those poles and returns to the shafts 121 to 124 shown in the drawing. As the result of such a closed magnetic circuit being formed, a magnetic flux caused by a current of the excitation coils 128 is transferred. Various multipole magnetic fields can be generated in proximity to the optical axis O in each stage of the poles Q1 to Q4 by adjusting a current passed through the excitation coils 128.

The second-stage to fourth-stage poles Q2 to Q4 are disposed at the thin portion 108 of the housing 103 and are not brought into contact with the housing 103. The shaft through hole 106 in the housing 103 is sufficiently larger than an outside diameter of the shaft 121 to 124 and is not brought into contact with the shaft 121 to 124. Since the ring magnetic paths 125 and the shafts 122, 123 are electrically insulated from each other by the insulation sleeves 126, a voltage can be independently applied to the tips of the poles Q2, Q3 by applying a voltage to the terminals 127. Various multipole electric fields can be generated in proximity to the optical axis O in the poles Q2, Q3 by adjusting a voltage applied to the respective 12 second-stage and third-stage poles Q2, Q3.

In Third Embodiment, the tapered side faces 112 in the rear face portion of the first-stage pole Q1 and a tapered groove 105 in the housing 103 are engaged with each other, the multipole 100B being thereby secured in the housing 103. The poles Q2 to Q4 are not engaged with a tapered groove 105 and thus are not brought into contact with the housing 103. For this reason, stress produced when the shafts 121 to 124 are inserted into the rear faces of the poles Q1 to Q4 is exerted only on the tapered grooves 105. Therefore, looseness in a screw S1 securing the multipole 100B and circumferential deformation in the tip portions of the poles Q1 to Q4 can be prevented.

According to Third Embodiment, a magnetic field-based chromatic and spherical aberration corrector excellent in uniformity in the dimensions of poles in each stage and the positions and circumferential orientation of poles can be provided without adjustment during assembly. In Third Embodiment, the multipole 100B may be a multipole including a cap C as in Second Embodiment or may be a multipole 100 including only pillars P1 to P3, and without a cap C, as in First Embodiment.

In the example shown in FIG. 6, only the pole Q1 has tapered side faces 112 but the present invention is not limited to this and other poles Q2 to Q4 may also have similar tapered side faces 112. The tapered grooves 105 in the housing 103 may be provided only at the upper end portion of the housing 103 as in FIG. 5 but the present invention is not limited to this and the tapered grooves 105 may have a length corresponding to a length of the multipole 100B. Alternatively, the tapered grooves 105 may be provided at both the upper end and the lower end of the housing 103 as in Fourth Embodiment described below.

Further, a multipole unit in Third Embodiment can be configured as a chromatic and spherical aberration corrector as mentioned above but the present invention is not limited to this and is also applicable to a spherical aberration corrector, a stigmator, a Wien filter, a deflector in a multipole configuration, and the like.

Fourth Embodiment

A description will be given to a chromatic and spherical aberration corrector 200A (hereafter, simply referred to as "aberration corrector 200A") in Fourth Embodiment with reference to FIG. 8 to FIG. 10. Also, in the description of Fourth Embodiment, a magnetic field-based chromatic and spherical aberration corrector (multistage multipole unit) having a multistage-connected multipole of 12 poles and four stages is taken as an example.

Figure 8:
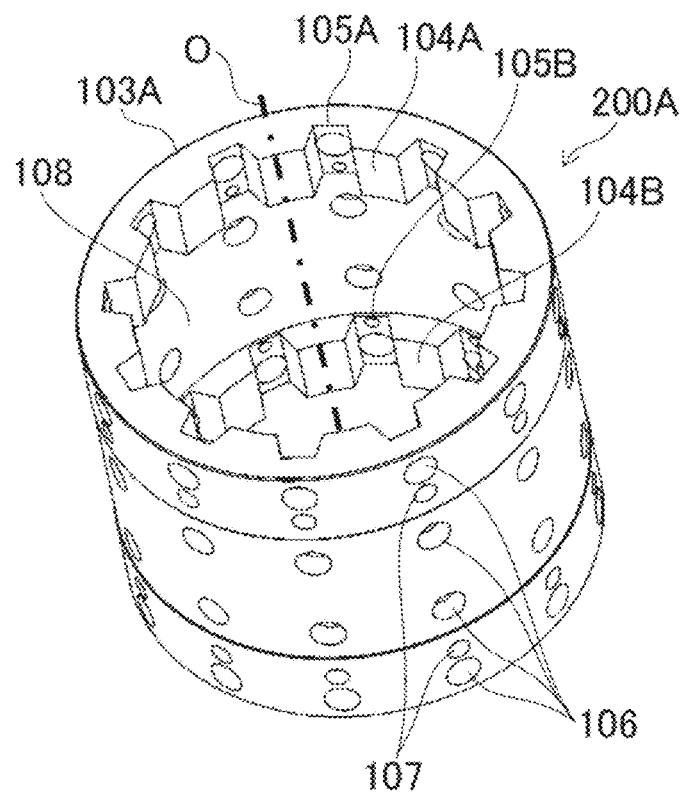
FIG. 8 is a schematic perspective view illustrating a structure of a chromatic and spherical aberration corrector 200A in Fourth Embodiment.

FIG. 8 is a diagrammatic sketch of a housing 103A of the aberration corrector 200A in Fourth Embodiment. The housing 103A has a shape of a cylinder with an axis O at the center as in Third Embodiment. The same components as of the housing 103 in Third Embodiment are marked with the same reference signs as in FIG. 5 and an overlapped description will be hereafter omitted.

The housing 103A has thick portions 104A and tapered grooves 105A not only at one end in the optical axis direction of the housing but has thick portions 104B and tapered grooves 105B also at the other end.

Figure 9:
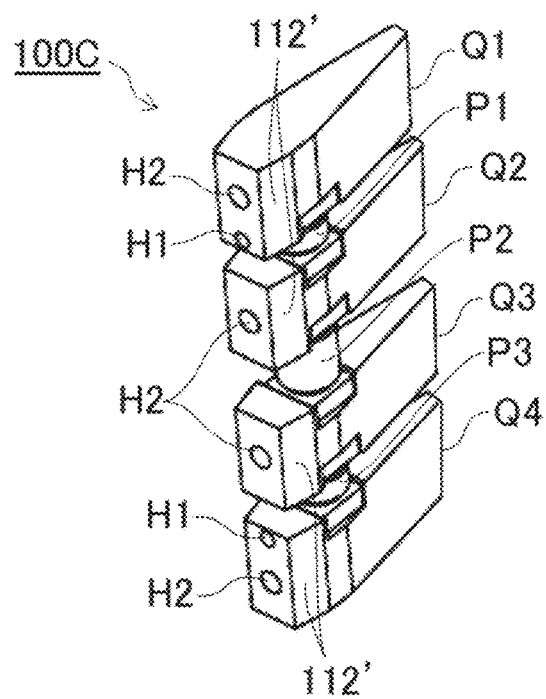
FIG. 9 is a schematic perspective view illustrating a structure of a multistage-connected multipole 100C attached to the housing 103A shown in FIG. 8.
Figure 10:
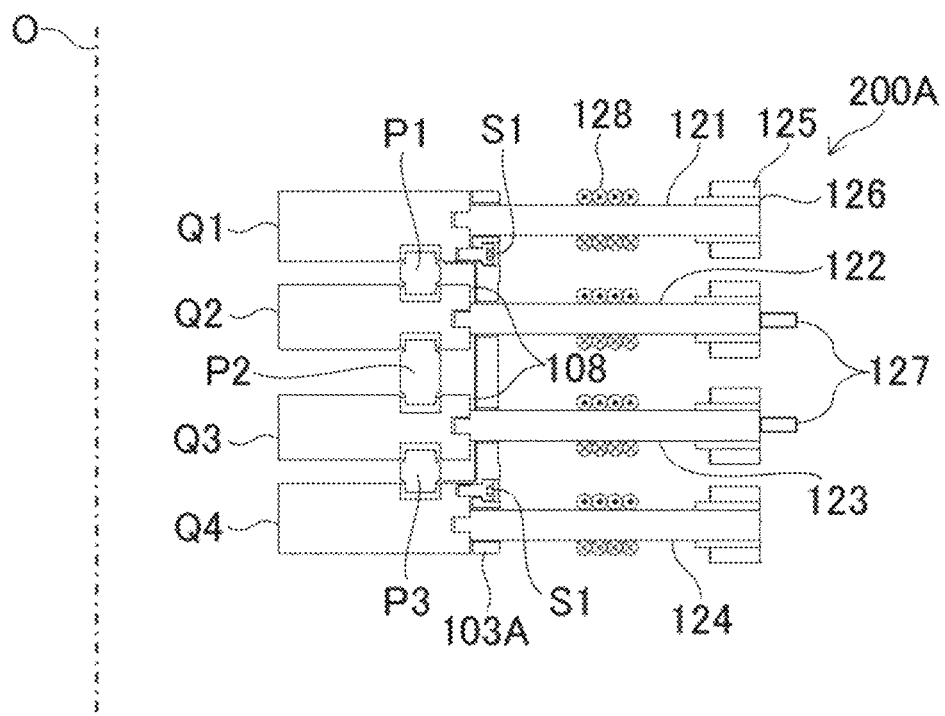
FIG. 10 is a schematic cross-sectional view of a chromatic and spherical aberration corrector 200A in Fourth Embodiment.

FIG. 9 is a diagrammatic sketch of a multistage-connected multipole 100C (hereafter, referred to as "multipole 100C") of four stages attached to the housing 103A. A structure of the multipole 100C is substantially identical with that in Third Embodiment. However, a tapered side face 112' is formed in all the side faces of the individual poles Q1, Q2, Q3, Q4 on the rear face side. The tapered side face 112' is formed with the same taper angle as that of each tapered groove 105 in the housing 103A. A screw hole H1 is provided in the rear faces of the pole Q1 and the pole Q4. A shaft mounting hole H2 is provided in all the rear faces of the poles Q1 to Q4.

In the multipole 100C in Fourth Embodiment, a tapered side face is provided in the rear faces of all the poles Q1 to Q4. As the result of such 12 multipoles 100C being inserted into the housing 103A, the aberration corrector 200A is constructed. In Fourth Embodiment, tapered side faces 112' at the rear face portion of the first-stage pole Q1 and a tapered groove 105A on one end side are engaged with other; tapered side faces 112' at the rear face portion of the fourth-stage pole Q4 and a tapered groove 105B on the other end side are engaged with each other; and the housing 103A and the multipole 100C are engaged with each other at two spots and secured together. As shown in FIG. 10, the multipole 100C is connected to the housing 103A by a screw S1 at two spots in the poles Q1, Q4. For this reason, when shafts 121, 122, 123, 124 are inserted into the rear faces of the poles Q1 to Q4, the multipole 100C's fixation and strength against stress can be made firmer.

Fourth Embodiment is suitable for cases where a length of the poles Q1 to Q4 in the optical axis direction or a length of the pillars P1 to P3 is increased for aberration correction in a charged particle optical system with a large aberration and an overall length of the multipole 100C is accordingly increased. In the case of the housing 103 having a tapered groove 105 provided only in one place in the optical axis direction as in First Embodiment, when an overall length of a multipole is increased, the multipole is inclined with respect to the axis O of the housing 103 during incorporation, causing a distance of the tip portion of the first-stage pole Q1 from the axis O and that of the fourth-stage pole Q4 to deviate from each other. In Fourth Embodiment, on the other hand, two tapered grooves 105A, 105B are provided in the housing 103A in the optical axis direction and the multipole 100C and the housing 103A are secured together in the two tapered grooves 105A, 105B. For this reason, the multipole 100C can be prevented from being inclined with respect to the optical axis direction. Consequently, according to a structure of Fourth Embodiment, a magnetic field-based chromatic and spherical aberration corrector excellent in uniformity in the dimensions of the poles Q1 to Q4 in each stage and the positions and circumferential orientation of the poles Q1 to Q4 can be provided without adjustment during assembly even when an overall length of the multipole 100C is large.

In the example shown in FIG. 9, all the poles Q1 to Q4 of the multipole 100C have a tapered side face 112' but the subject matter of the present invention is not limited to this and a structure in which only the poles Q1, Q4 have a tapered side face 112' may be adopted as long as the multipole 100C can be secured in the housing 103A.

Fifth Embodiment

A description will be given to a chromatic and spherical aberration corrector 200B (hereafter, simply referred to as "aberration corrector 200B") in Fifth Embodiment with reference to FIG. 11. Also, in the description of Fifth Embodiment, a chromatic and spherical aberration corrector having a multistage-connected multipole of 12 poles and four stages will be taken as an example. However, in the description of Fifth Embodiment, an electrostatic-based, rather than a magnetic field-based, chromatic and spherical aberration corrector is taken as an example.

Figure 11:
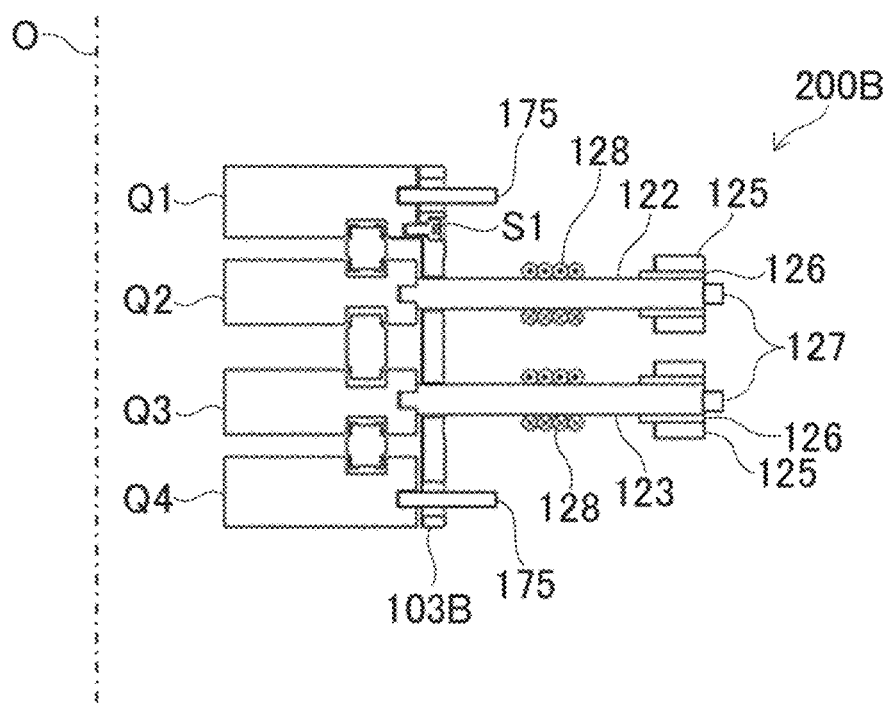
FIG. 11 is a schematic cross-sectional view illustrating a chromatic and spherical aberration corrector 200B in Fifth Embodiment.

FIG. 11 is a schematic cross-sectional view of an aberration corrector in Fifth Embodiment. A configuration of a housing 103B is substantially identical with that of the housing 103 in Third Embodiment and an overlapped description and drawing will be omitted. A structure of a multipole attached to the housing 103B may be identical with the above-mentioned embodiments and a description will also be omitted. Needless to add, structures of the housing 103B and the multipole may be replaced with those in Fourth Embodiment. In any case, however, the poles Q1 to Q4 and the housing 103B must be electrically insulated from each other because a voltage is independently applied to all the poles Q1 to Q4.

For this purpose, the housing 103B in Fifth Embodiment is formed of such a non-magnetic insulation material as alumina or resin. A terminal 175 (second terminal) is inserted into the poles Q1, Q4 through a shaft through hole 106 drilled in the housing 103B. Meanwhile, a shaft 122, 123 formed using soft magnetic metal as a material is inserted into the poles Q2, Q3 as in the above-mentioned embodiments. A terminal 175 is inserted directly into the poles Q1, Q4 without the intervention of a shaft. Meanwhile, a terminal 127 (first terminal) is connected to the rear ends of the shafts 122, 123. An insulation sleeve 126 is inserted onto the shafts 122, 123 and a cylindrical ring magnetic path 125 formed of soft magnetic metal is secured over the insulation sleeve. An excitation coil 128 is wound around each of the shafts 122, 123.

Since each pole Q1 to Q4 is electrically insulated from the remaining poles and the housing 103B, various multipole electric fields can be generated in proximity to the optical axis O in each of the poles Q1, Q2, Q3, Q4 by applying a voltage to the terminals 175 and 127.

In Fifth Embodiment, the housing 103B is formed of a non-magnetic insulation material. For this reason, a magnetic flux excited in the shafts 122, 123 of soft magnetic metal by passing a current through the excitation coils 128 is transferred to the second-stage and third-stage poles Q2, Q3. The magnetic flux further returns to the original shafts 122, 123 by way of other circumferentially disposed poles, shafts attached to those poles, and ring magnetic paths 125. As the result of such a closed magnetic circuit being formed, a magnetic flux caused by a current of the excitation coils 128 is transferred. Various magnetic fields can be generated in proximity to the optical axis O in the poles Q2, Q3 by adjusting a current passed through the excitation coils 128.

According to Fifth Embodiment, an electrostatic-based chromatic and spherical aberration corrector that obviates need for adjustment during assembly, is excellent in the dimensional accuracy of poles, and is small in displacement between stages and circumferential displacement can be implemented. A material of the housing 103B is not limited to an insulation material. When the housing 103B is of non-magnetic metal, an insulating thin film of resin or the like may be inserted into an inner wall of a tapered groove in the housing 103B brought into contact with the rear face portions of the poles Q1 to Q4 for electrical insulation between the poles Q1 to Q4 and the housing 103B. Alternatively, insulation can also be ensured by applying an insulating coating to the rear face portions of the poles Q1 to Q4 or the tapered grooves.

Sixth Embodiment

Figure 12:
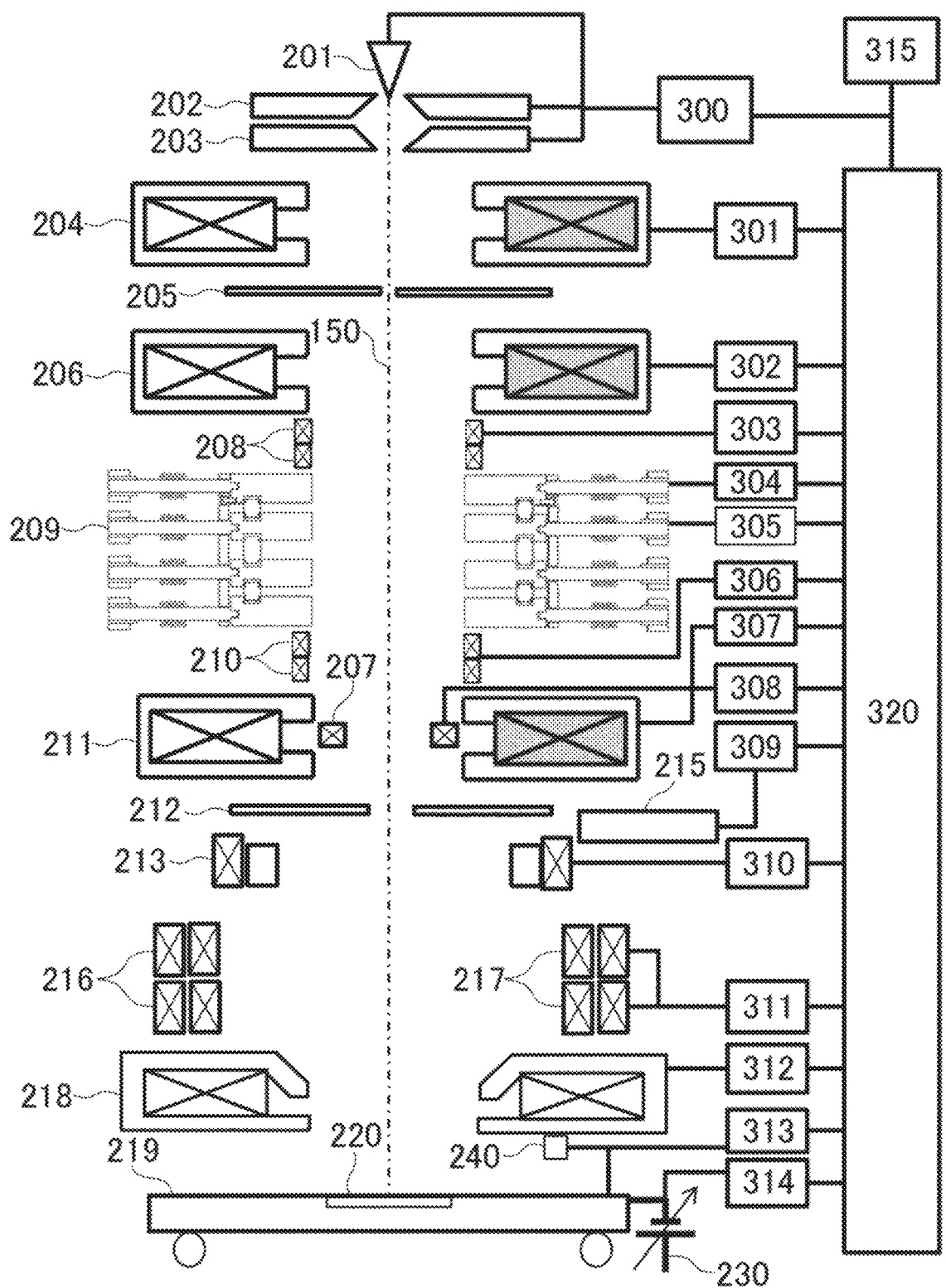
FIG. 12 is a schematic diagram illustrating an overall configuration of a charged particle beam device in Sixth Embodiment.

A description will be given to Sixth Embodiment with reference to FIG. 12 to FIG. 14. Sixth Embodiment relates to a charged particle beam device equipped with a chromatic and spherical aberration corrector in the above-mentioned embodiments. As an example, FIG. 12 shows a diagrammatic sketch of an electrooptic column of a SEM (charged particle beam device) for semiconductor measurement and inspection equipped with a magnetic field-based chromatic and spherical aberration corrector 209 as in Third Embodiment.

The charged particle beam device includes a cathode 201, a first anode 202, and a second anode 203. An extraction voltage is applied to between the cathode 201 and the first anode 202 by an electron gun control unit 300 and primary electrons are ejected from the cathode 201 with a predetermined current density.

An acceleration voltage is applied to between the cathode 201 and the second anode 203 by the electron gun control unit 300 and the primary electrons are accelerated and struck out to a subsequent charged particle optical system. The charged particle beam optical system is formed with, for example, a first condenser lens 204, an objective movable diaphragm 205, a second condenser lens 206, the chromatic and spherical aberration corrector 209, a third condenser lens 211, and an objective lens 218. The primary electrons are focused by the first condenser lens 204 whose excitation current is controlled by a first condenser lens control unit 301. As a result, a predetermined current is passed through an opening in the objective movable diaphragm 205.

The primary electrons that were passed through the objective movable diaphragm 205 are passed through the second condenser lens 206 whose excitation current is controlled by a second condenser lens control unit 302. As a result, the primary electrons are adjusted into a beam path parallel to an optical axis 150.

Thereafter, the primary electrons enter the chromatic and spherical aberration corrector 209 whose excitation current and applied voltage are controlled by a correction current control unit 304 and a correction voltage control unit 305. As a result, a chromatic aberration and a spherical aberration of the charged particle beam optical system are compensated and an angle of the path of primary electrons is adjusted and the primary electrons are ejected from the chromatic and spherical aberration corrector 209.

Thereafter, the primary electrons are focused in an appropriate position on the optical axis O by the third condenser lens 211 whose excitation current is controlled by a third condenser lens control unit 307. Thereafter, the primary electrons are further focused by the objective lens 218 whose excitation current is controlled by an objective lens control unit 312. The primary electrons ejected from the objective lens 218 is focused on a wafer 220 placed on a stage 219 controlled by a stage control unit 313 and a micro spot is formed on the wafer 220. At this time, an angular variation of the primary electrons adjusted by the chromatic and spherical aberration corrector 209 and an angular variation produced on the path of the primary electrons by a chromatic and spherical aberration of the objective lens 218 are canceled out by each other and the micro spot with an aberration compensated is formed.

The stage 219 is connected with a retarding power source 230 controlled by a retarding voltage control unit 314. The retarding voltage control unit 314 applies a deceleration voltage to generate a retarding field between the objective lens 218 and the wafer 220. This deceleration voltage allows a voltage of irradiation of the wafer 220 with the primary electrons to be changed. An excitation current of the objective lens 218 is set based on a working distance measured by a specimen height measuring instrument 240 controlled by the stage control unit 313.

The primary electrons are scanned on the wafer 220 by a scanning deflector 217 controlled by a deflector control unit 311. Secondary electrons are generated by interaction between the primary electrons and a fine pattern formed on the wafer 220. The generated secondary electrons pass through the objective lens 218 to form a spot having a broadness on a secondary electron conversion board 212. The secondary electrons are scanned on the secondary electron conversion board 212 by the scanning deflector 217 and tertiary electrons are generated by interaction.

The tertiary electrons are deflected toward a detector 215 by an ExB deflector 213 and detected by the detector 215. The detector 215 is controlled by a detector control unit 309. The ExB deflector 213 has an applied voltage and an excitation current of the ExB deflector controlled by an ExB control unit 310. The tertiary electrons detected by the detector 215 are converted into an electrical signal and subjected to computation at an optical system control unit 320 and displayed as a SEM image at an image display unit 315. To move a coverage of a SEM image, the stage 219 controlled by the stage control unit 313 is moved or an irradiation position of the primary electrons on the wafer 220 is moved from the optical axis 150 by an image shift deflector 216 controlled by the deflector control unit 311.

When the chromatic and spherical aberration corrector 209 is assembled with its central axis displaced from the optical axis 150, primary electrons entering the chromatic and spherical aberration corrector 209 are shifted toward the central axis of the chromatic and spherical aberration corrector 209 by a two-stage deflector 208 controlled by a deflector control unit 303. Primary electrons ejected from the chromatic and spherical aberration corrector 209 are shifted toward the optical axis 150 by a two-stage deflector 210 controlled by a deflector control unit 306. Further, a stigmator 207 controlled by a stigmator control unit 308 compensates a parasitic astigmatism of the electrooptic column.

The present chromatic and spherical aberration corrector 209 is a quadrupole to octopole-based aberration corrector and a corrector capable of performing correction of a chromatic aberration and a spherical aberration. Quadrupole and octopole electromagnetic fields are formed in each stage of the aberration corrector 209. When dodecapole electrodes and magnetic poles are additionally used, aside from quadrupole and octopole, dipole, hexapole, and dodecapole electromagnetic fields can be superposedly generated. These multipole fields can be used to compensate a parasitic aberration, for example, beam deflection, axial coma, three-fold astigmatism, four-fold astigmatism, and the like, caused by an assembling error of an electrode and a magnetic pole or ununiformity of a magnetic pole material.

An aberration corrector used in a charged particle beam device in Sixth Embodiment is not limited to a magnetic field-based chromatic and spherical aberration corrector in Third Embodiment. A magnetic field-based chromatic and spherical aberration corrector described in relation to Fourth Embodiment is also acceptable or an electrostatic-based chromatic and spherical aberration corrector described in relation to Fifth Embodiment is also acceptable. An aberration corrector in the present embodiment is not limited to a chromatic and spherical aberration corrector and may be an aberration corrector compensating only chromatic aberrations or only spherical aberrations.

In the description of Sixth Embodiment, a SEM is taken as an example of a charged particle beam device equipped with an aberration corrector and the charged particle beam device need not be a SEM and may be a scanning transmission electron microscope, a transmission electron microscope, a scanning ion microscope, a focused ion beam device, or the like.

A description will be given to an example of a case where a multistage-connected multipole or an aberration corrector in the above-mentioned embodiments is applied to a scanning transmission electron microscope. An aberration corrector in the above-mentioned embodiments is placed between an electron source and a condenser lens and an objective lens and a thin film specimen is set under the objective lens. Further, a deflector for scanning primary electrons on the specimen is placed between the aberration corrector and the thin film specimen and a detector is placed below the thin film specimen. Primary electrons ejected from the electron source are focused on the thin film specimen through the condenser lens, the aberration corrector according to the above-mentioned embodiments, and the objective lens, and primary electrons focused by the deflector are scanned on the specimen. Primary electrons that transmitted the thin film specimen are detected by the detector placed below the specimen.

A description will be given to an example of a case where a multistage-connected multipole or an aberration corrector in the above-mentioned embodiments is applied to a transmission electron microscope. A thin film specimen is set between an electron source and a condenser lens and an objective lens, an aberration corrector in the above-mentioned embodiments and a plurality of projection lenses are placed below the objective lens, and a detector is placed below the aberration corrector and the projection lenses. Primary electrons ejected from the electron source illuminate the thin film specimen through the condenser lens and primary electrons that transmitted the thin film specimen are enlarged and projected onto the detector through the objective lens, the aberration corrector, and the projection lenses with an aberration compensated and detected there.

A description will be given to a method for compensating an aberration of a charged particle beam in a charged particle beam device equipped with a chromatic and spherical aberration corrector as in Sixth Embodiment with reference to FIG. 13 and FIG. 14.

Figure 13:
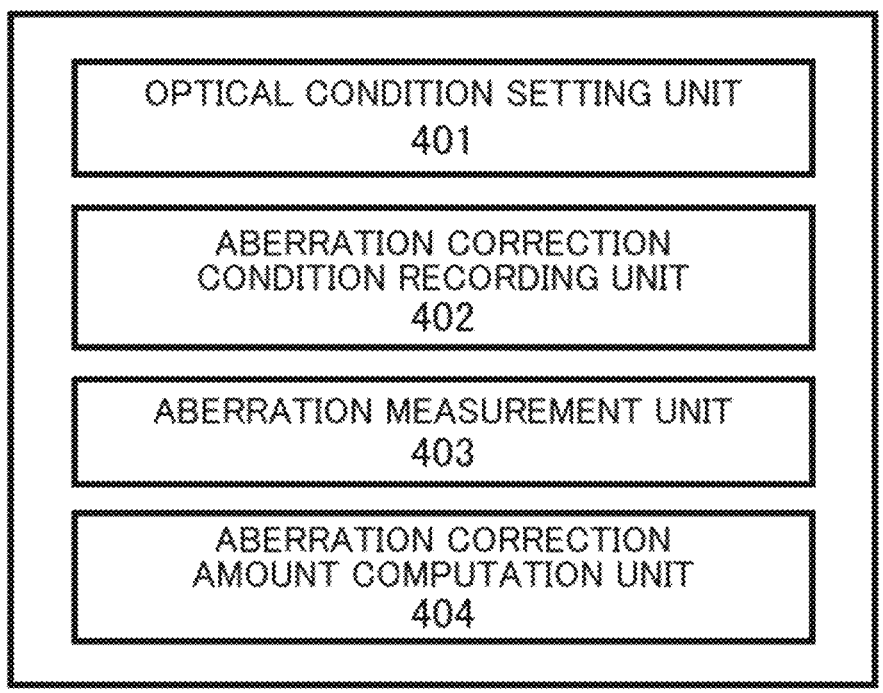
FIG. 13 is a block diagram illustrating an example of a configuration of an optical system control unit 320 used when compensating an aberration of a charged particle beam in a charged particle beam device equipped with a chromatic and spherical aberration corrector as in Sixth Embodiment.
Figure 14:
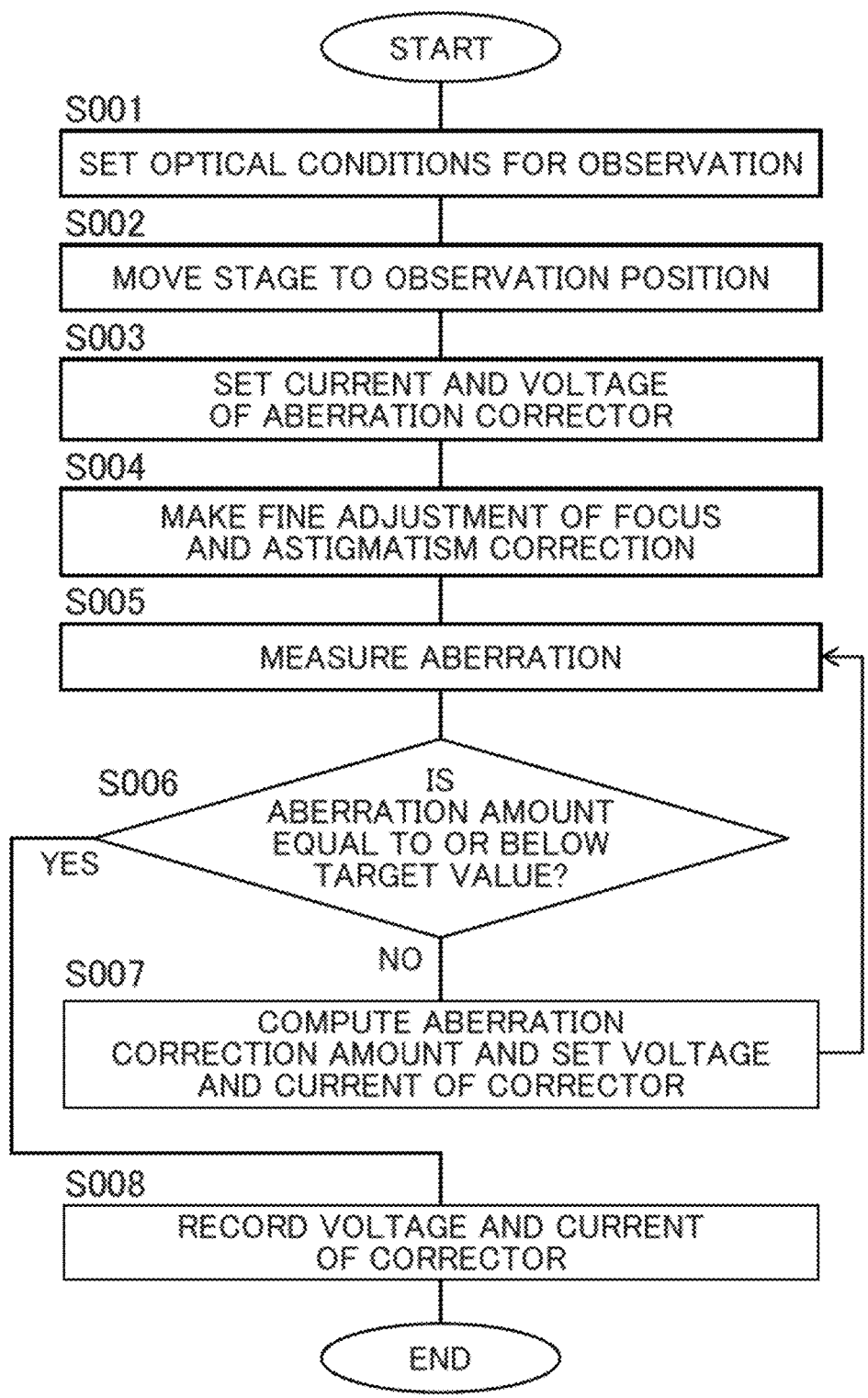
FIG. 14 is a flowchart illustrating a procedure for compensating an aberration of a charged particle beam in a charged particle beam device equipped with a chromatic and spherical aberration corrector as in Sixth Embodiment.

FIG. 13 is a block diagram illustrating an example of a configuration of an optical system control unit 320 used to perform the aberration correction method; and FIG. 14 is a flowchart illustrating a procedure for performing the method for compensating an aberration of primary electrons.

At Step S001, first, optical conditions (an acceleration voltage, an excitation current of a condenser lens, a retarding voltage, and the like) for observation are set through each control unit by an optical condition setting unit 401 in FIG. 13. An aberration correction condition recording unit 402 records operating conditions for the chromatic and spherical aberration corrector 209 and the like in accordance with the set optical conditions.

At Step S002, subsequently, the stage 219 is moved to an observation position, and at Step S003, thereafter, operating conditions for the chromatic and spherical aberration corrector 209 recorded in the aberration correction condition recording unit 402 are read and the operating conditions are set through the correction current control unit 304 and the correction voltage control unit 305.

When setting of the operating conditions is completed, at Step S004, subsequently, fine adjustment of focus and astigmatism correction is made. At Step S005, a chromatic aberration and a geometric aberration of the charged particle beam optical system are measured by an aberration measurement unit 403.

At Step S006, it is determined from a result of chromatic aberration and geometric aberration measurements whether an aberration amount of the electro-optical system is compensated to a target aberration amount or below. When the aberration amount is higher than the targe value (No), the processing proceeds to Step S007. At the step, an excitation current and an applied voltage of each pole Q1 to Q4 of the chromatic and spherical aberration corrector 209 are computed by an aberration correction amount computation unit 404 and the computed current and voltage are set through the correction current control unit 304 and the correction voltage control unit 305. Thereafter, the processing returns to Step S005 and the above-mentioned operation is repeated.

Meanwhile, when it is determined at Step S006 that the aberration amount is equal to or below the target value (Yes), the processing proceeds to Step S008 and an excitation current and an applied voltage of each pole Q1 to Q4 are recorded in an operating condition table for the chromatic and spherical aberration corrector 209 in the aberration correction condition recording unit 402 and updated.

Up to this point, a description has been given to embodiments of the present invention and these embodiments are presented as examples and are not intended to limit the scope of the prevent invention. These novel embodiments can be implemented in other various modes than described above and can be variously omitted, replaced, or modified without departing from the subject matter of the present invention. These embodiments and modifications to the embodiments are included in the scope and subject matter of the present invention and are further included in the invention described in Claims and a scope of equivalents to the invention.

LIST OF REFERENCE SIGNS

Q1 to Q4 . . . Pole, N . . . Notch, C . . . Cap, P1 to P3, P11 to P13 . . . Pillar, 11 . . . Recessed portion, 12 . . . Protrusion, 1 . . . Pole base material, 2 . . . Tip side connecting portion, 3 . . . Rear face side connecting portion, 11 to 14 . . . Block, H1 . . . Screw hole, H2 . . . Shaft mounting hole, 100, 100A, 100B . . . Multistage-connected multipole, 103, 103A, 103B . . . Housing, 104, 104A . . . Thick portion, 105, 105A . . . Tapered groove, 106 . . . Shaft through hole, 107 . . . Screw through hole, S1 . . . Screw, 108 . . . Thin portion, 0 . . . Axis, 112, 112' . . . Tapered side face, 121 to 124 . . . Shaft, 125 . . . Ring magnetic path, 126 . . . Insulation sleeve, 127 . . . Terminal, 128 . . . Coil, 201 . . . Cathode, 202 . . . First anode, 203 . . . Second anode, 204 . . . First condenser lens, 205 . . . Objective movable diaphragm, 206 . . . Second condenser lens, 207 . . . Stigmator, 208 . . . Two-stage deflector, 209 . . . Chromatic and spherical aberration corrector, 210 . . . Two-stage deflector, 211 . . . Third condenser lens, 212 . . . Secondary electron conversion board, 213 . . . ExB deflector, 215 . . . Detector, 216 . . . Image shift deflector, 217 . . . Scanning deflector, 218 . . . Objective lens, 219 . . . Stage, 220 . . . Wafer, 230 . . . Retarding power source, 240 . . . Specimen height measuring instrument, 300 . . . Electron gun control unit, 301 . . . First condenser lens control unit, 302 . . . Second condenser lens control unit, 303 . . . Deflector control unit, 304 . . . Correction current control unit, 305 . . . Correction voltage control unit, 306 . . . Deflector control unit, 307 . . . Third condenser lens control unit, 308 . . . Stigmator control unit, 309 . . . Detector control unit, 310 . . . ExB control unit, 311 . . . Deflector control unit, 312 . . . Objective lens control unit, 313 . . . Stage control unit, 314 . . . Retarding voltage control unit, 315 . . . Image display unit, 320 . . . Optical system control unit, 401 . . . Optical condition setting unit, 402 . . . Aberration correction condition recording unit, 403 . . . Aberration measurement unit, 404 . . . Aberration correction amount computation unit

The invention claimed is:

1. A multistage-connected multipole comprising:
   a plurality of poles disposed along an optical axis direction of a charged particle beam and having a notch in opposed surfaces; and
   a pillar disposed between the poles and comprised of an insulator,
   wherein the poles and the pillars are joined with each other in the notches via a joining material.

2. A multistage-connected multipole according to claim 1, further comprising:
   a cap joined to the notch via the joining material,
   wherein the pillar is joined to the pole via the cap.

3. The multistage-connected multipole according to claim 2,
wherein the pillar and the cap include a protruded portion and a recessed portion that can be engaged with each other.

4. The multistage-connected multipole according to claim 1,
wherein a material of an insulator constituting the pillar is ceramic, and
wherein the joining material is a brazing material.

5. The multistage-connected multipole according to claim 1,
wherein a plurality of end faces of the poles at least on one end side are in a shape in accordance with one plane.

6. The multistage-connected multipole according to claim 5,
wherein before the pillar is joined via the joining material, the poles are connected to one connecting portion and are formed as a single pole base material together with the connecting portion.

7. The multistage-connected multipole according to claim 6,
wherein the connecting portion connects at two places of one end side and the other end side of the pole.

8. The multistage-connected multipole according to claim 1,
wherein the poles are formed using soft magnetic metal as a material.

9. A multistage multipole unit comprising:
a plurality of multistage-connected multipoles;
a housing in a cylindrical shape with which the multistage-connected multipoles are connected,
wherein the multistage-connected multipole includes: a plurality of poles disposed along an optical axis direction of a charged particle beam and having notches in opposed surfaces; and a pillar disposed between the poles and comprised of an insulator, the pole and the pillar being joined with each other in the notches via a joining material,
wherein the housing includes grooves disposed at predetermined intervals in the circumferential direction of the cylindrical shape and parallel in the optical axis direction, and
wherein the multistage-connected multipoles are fit into the grooves.

10. The multistage multipole unit according to claim 9, wherein side walls of the groove have a taper shape, and
wherein one end of the pole has the same taper angle as the taper shape.

11. The multistage multipole unit according to claim 9, further comprising:
a shaft connected to the multistage-connected multipole through a through hole provided in the housing;
a ring magnetic path attached to one end of the shaft; and
an excitation coil wound around the shaft.

12. The multistage multipole unit according to claim 9, further comprising:
a cap joined to the notch via the joining material,
wherein the pillar is joined to the pole via the cap.

13. The multistage multipole unit according to claim 12,
wherein the pillar and the cap include a protruded portion and a recessed portion that can be engaged with each other.

14. The multistage multipole unit according to claim 9,
wherein a plurality of end faces of the poles at least on one end side are in a shape in accordance with one plane.

15. The multistage multipole unit according to claim 14,
wherein before the pillar is joined via the joining material, the poles are connected to one connecting portion and are formed as a single pole base material together with the connecting portion.

16. The multistage multipole unit according to claim 9, further comprising:
a shaft connected to a first pole of the poles of the multistage-connected multipole through a through hole provided in the housing;
a first terminal connected to the shaft;
a second terminal connected to a second pole of the poles of the multistage-connected multipole;
a ring magnetic path attached to one end of the shaft; and
an excitation coil wound around the shaft.

17. A charged particle beam device comprising:
a charged particle source ejecting a charged particle;
a charged particle beam optical system focusing the charged particle; and
a multistage multipole unit as an aberration corrector included in the charged particle beam optical system,
wherein the multistage multipole unit includes a plurality of multistage-connected multipoles, and
wherein the multistage-connected multipoles include: a plurality of poles disposed along an optical axis direction of a charged particle beam and having notches in opposed surfaces; and a pillar disposed between the poles and comprised of an insulator, the pole and the pillar being joined with each other in the notches via a joining material.

18. The charged particle beam device according to claim 17, further comprising:
a cap joined to the notch via the joining material,
wherein the pillar is joined to the pole via the cap.

19. The charged particle beam device according to claim 18,
wherein the pillar and the cap include a protruded portion and a recessed portion that can be engaged with each other.

20. The charged particle beam device according to claim 17, further comprising:
an aberration measurement unit measuring a chromatic aberration and a geometric aberration of the charged particle beam optical system;
an aberration correction amount computation unit computing an applied voltage and an excitation current to the multistage-connected multipole in accordance with a result of measurement at the aberration measurement unit; and
an aberration correction condition recording unit storing a result of computation at the aberration correction amount computation unit.

* * * * *